(12) United States Patent
Basu et al.

(10) Patent No.: US 10,451,660 B2
(45) Date of Patent: Oct. 22, 2019

(54) MONITORING OPERATING CONDITIONS OF A TRANSFORMER DURING MAJOR ELECTROMAGNETIC DISTURBANCES

(71) Applicant: Utopus Insights, Inc., Valhalla, NY (US)

(72) Inventors: Chumki Basu, Bangalore (IN); Manikandan Padmanaban, Chennai (IN)

(73) Assignee: Utopus Insights, Inc., Valhalla, NY (US)

( * ) Notice: Subject to any disclaimer, the term of this patent is extended or adjusted under 35 U.S.C. 154(b) by 525 days.

(21) Appl. No.: 14/755,562

(22) Filed: Jun. 30, 2015

(65) Prior Publication Data

US 2017/0003329 A1 Jan. 5, 2017

(51) Int. Cl.
*G01R 19/28* (2006.01)
*G01R 31/02* (2006.01)
*G01R 21/133* (2006.01)

(52) U.S. Cl.
CPC ............ *G01R 19/28* (2013.01); *G01R 31/027* (2013.01); *G01R 21/1331* (2013.01)

(58) Field of Classification Search
CPC .......... H02H 1/0092; H02H 3/08; H02H 3/52; G05F 5/00; H01F 27/34; G01R 31/001; G01R 31/002; G01R 31/02; G01R 31/027; G01R 31/1331
See application file for complete search history.

(56) References Cited

U.S. PATENT DOCUMENTS

| | | | | |
|---|---|---|---|---|
| 4,654,806 A | * | 3/1987 | Poyser | ...................... H02H 3/00 324/726 |
| 2010/0188240 A1 | | 7/2010 | Wells | |
| 2012/0019965 A1 | | 1/2012 | Faxvog et al. | |
| 2013/0285671 A1 | * | 10/2013 | Hoffman | .............. G01R 31/027 324/547 |
| 2013/0308229 A1 | | 11/2013 | Faxvog et al. | |
| 2014/0337112 A1 | * | 11/2014 | Dessert | .............. G06Q 30/0267 705/14.23 |

FOREIGN PATENT DOCUMENTS

| | | |
|---|---|---|
| CN | 1632602 A | 6/2005 |
| CN | 1316256 C | 5/2007 |

OTHER PUBLICATIONS

Marti et al., "Determination of Geomagnetically Induced Current flow in a Transformer from Reactive power Absorption," IEEE Transaction on Power delivery, vol. 28, No. 3, Jul. 2013.*

(Continued)

*Primary Examiner* — Steven B Gauthier
(74) *Attorney, Agent, or Firm* — Ahmann Kloke LLP

(57) ABSTRACT

Methods and arrangements for computing disruptive current in a transformer. Transformer current is measured, and disruptive current is predicted. Based on the active transformer current and predicted disruptive current, a predicted reactive power and predicted neutral current are determined. At least one corrective action, to be taken with respect to the transformer, is thereupon identified. Other variants and embodiments are broadly contemplated herein.

17 Claims, 5 Drawing Sheets

(56) References Cited

OTHER PUBLICATIONS

Berge, Jonathan E., "Impact of Geomagnetically Induced Currents on Power Transformers", University of Western Ontario—Electronic Thesis and Dissertation Repository, Apr. 2011, 142 pages, Paper 132, Scholarship@Western, London, Ontario, Canada.
Bernhardi, E.H., et al., "Improvement in the modelling of geomagnetically induced currents in southern Africa", South African Journal of Science, Sep./Aug. 2008, 13 pages, vol. 104, No. 7-8, Pretoria, South Africa.
Marti, Luis, et al., "Determination of Geomagnetically Induced Current Flow in a Transformer From Reactive Power Absorption", IEEE Transactions on Power Delivery, Jul. 2013, 9 pages, vol. 28, No. 3, IEEE Digital Library.
Powerworld, Product Website, 3 pages, Copy available at: http://www.powerworld.com/, Accessed on Feb. 24, 2015.
PSS/E, Product Website, 2 pages, Copy available at: http://w3.siemens.com/smartgrid/global/en/products-systems-solutions/software-solutions/planning-data-management-software/planning-simulation/pages/pss-e.aspx, Accessed on Feb. 24, 2015.
PSLF, Product Website, 2 pages, Copy available at: http://www.geenergyconsulting.com/practice-area/software-products/pslf, Accessed on Feb. 24, 2015.
Horton, Randy, Ph.D., P.E., et al, "GIC Calculations Using EPRI OpenDSS Software", EPRI/NERC GMD Workshop, Apr. 19, 2012, 68 pages, Electric Power Research Institute (EPRI).

\* cited by examiner

MONITORING OPERATING CONDITIONS OF A TRANSFORMER DURING MAJOR ELECTROMAGNETIC DISTURBANCES

BACKGROUND

Electric transformers are usually highly vulnerable to major electromagnetic disturbances, such as geomagnetic disturbances. Typically, transformers are designed on an assumption of one such occurrence every eleven years, and it has often been recognized that complex, dedicated infrastructure is needed to understand the state of a system, or transformer, during such disturbances.

Conventional arrangements do not provide an affordable, viable manner for estimating reactive power consumption, geomagnetic induced current flows in "the neutral" and saturation condition of the transformer in real time. Nor do such arrangements present a capability for predicting the effect of geomagnetic disturbances in the transformer using the forecasted geomagnetic activity to take corrective actions proactively.

BRIEF SUMMARY

In summary, one aspect of the invention provides a method of computing disruptive current in a transformer, said method comprising: utilizing at least one processor to execute computer code configured to perform the steps of: measuring active current in the transformer; predicting disruptive current in the transformer; determining, based on the active current and the predicted disruptive current, a predicted reactive power consumption of the transformer and a predicted neutral current in the transformer; and thereupon identifying at least one corrective action to be taken with respect to the transformer.

Another aspect of the invention provides an apparatus for computing disruptive current in a transformer, said apparatus comprising: at least one processor; and a computer readable storage medium having computer readable program code embodied therewith and executable by the at least one processor, the computer readable program code comprising: computer readable program code configured to measure active current in the transformer; computer readable program code configured to predict disruptive current in the transformer; computer readable program code configured to determine, based on the active current and the predicted disruptive current, a predicted reactive power consumption of the transformer and a predicted neutral current in the transformer; and computer readable program code configured to thereupon identify at least one corrective action to be taken with respect to the transformer.

A further aspect of the invention provides a computer program product for computing disruptive current in a transformer, said computer program product comprising: a computer readable storage medium having computer readable program code embodied therewith, the computer readable program code comprising: computer readable program code configured to measure active current in the transformer; computer readable program code configured to predict disruptive current in the transformer; computer readable program code configured to determine, based on the active current and the predicted disruptive current, a predicted reactive power consumption of the transformer and a predicted neutral current in the transformer; and computer readable program code configured to thereupon identify at least one corrective action to be taken with respect to the transformer.

An additional aspect of the invention provides a method comprising: measuring active current in a transformer; said measuring comprising determining even-order higher frequency components of the active current in the transformer; predicting disruptive current in the transformer; said predicting comprising predicting even-order higher frequency components of current attributable to the predicted disruptive current; wherein the disruptive current comprises a geomagnetically-induced current; determining, based on the active current and the predicted disruptive current, a predicted reactive power consumption of the transformer and a predicted neutral current in the transformer; and determining, based on the active current and the predicted disruptive current, estimated active parameters of the transformer; wherein the estimated active parameters include at least one of: operating conditions, reactive power and neutral current.

For a better understanding of exemplary embodiments of the invention, together with other and further features and advantages thereof, reference is made to the following description, taken in conjunction with the accompanying drawings, and the scope of the claimed embodiments of the invention will be pointed out in the appended claims.

DETAILED DESCRIPTION

Figure 1:
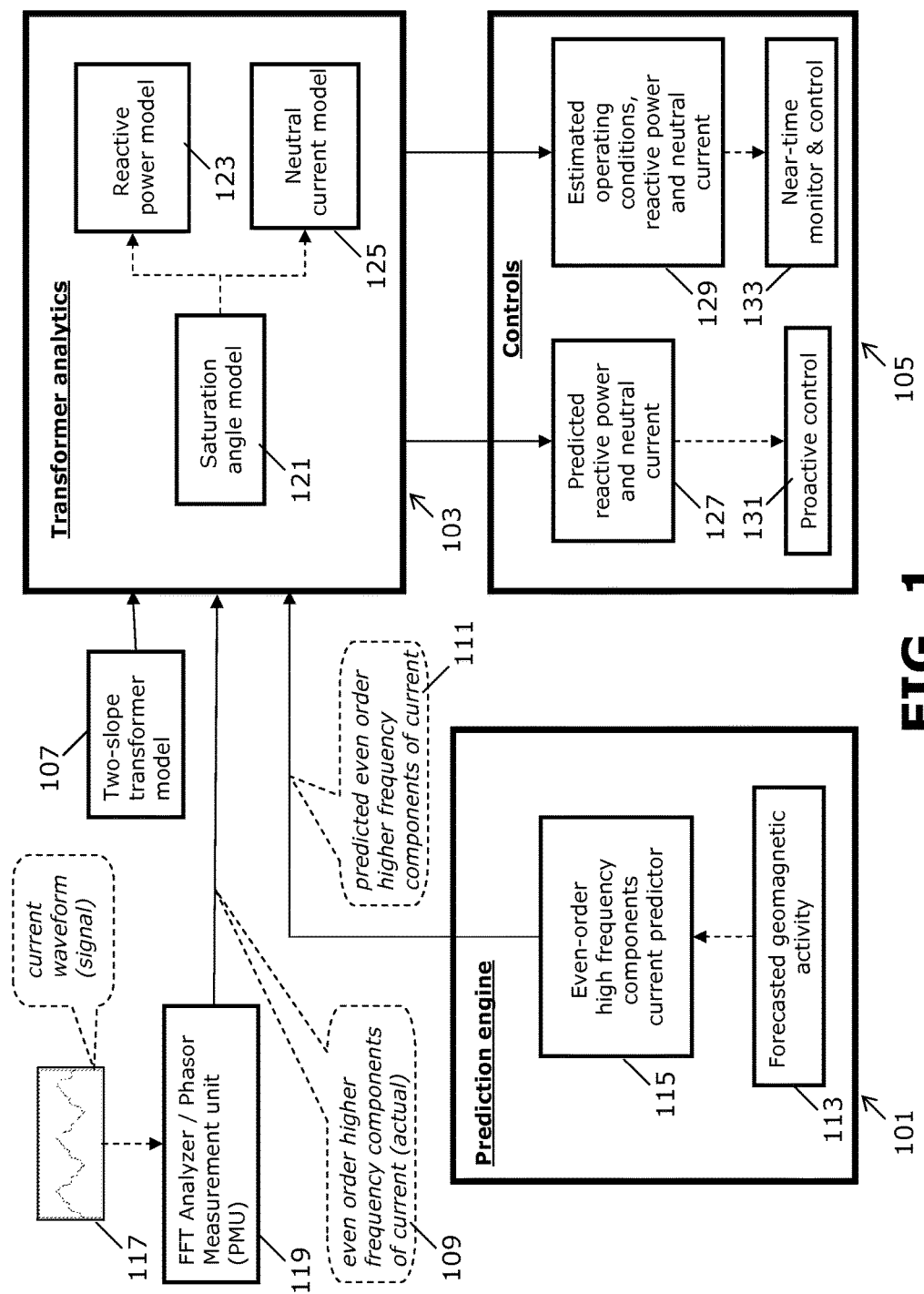
FIG. 1 schematically illustrates a general system architecture.

It will be readily understood that the components of the embodiments of the invention, as generally described and illustrated in the figures herein, may be arranged and designed in a wide variety of different configurations in addition to the described exemplary embodiments. Thus, the following more detailed description of the embodiments of the invention, as represented in the figures, is not intended to limit the scope of the embodiments of the invention, as claimed, but is merely representative of exemplary embodiments of the invention.

Reference throughout this specification to "one embodiment" or "an embodiment" (or the like) means that a particular feature, structure, or characteristic described in connection with the embodiment is included in at least one embodiment of the invention. Thus, appearances of the phrases "in one embodiment" or "in an embodiment" or the like in various places throughout this specification are not necessarily all referring to the same embodiment.

Furthermore, the described features, structures, or characteristics may be combined in any suitable manner in at least one embodiment. In the following description, numerous specific details are provided to give a thorough understanding of embodiments of the invention. One skilled in the relevant art may well recognize, however, that embodiments of the invention can be practiced without at least one of the specific details thereof, or can be practiced with other methods, components, materials, et cetera. In other instances, well-known structures, materials, or operations are not shown or described in detail to avoid obscuring aspects of the invention.

The description now turns to the figures. The illustrated embodiments of the invention will be best understood by reference to the figures. The following description is intended only by way of example and simply illustrates certain selected exemplary embodiments of the invention as claimed herein.

Specific reference will now be made here below to FIG. 1-3. It should be appreciated that the processes, arrangements and products broadly illustrated therein can be carried out on, or in accordance with, essentially any suitable computer system or set of computer systems, which may, by way of an illustrative and non-restrictive example, include a system or server such as that indicated at 12' in FIG. 5. In accordance with an exemplary embodiment, most if not all of the process steps, components and outputs discussed with respect to FIGS. 1-3 can be performed or utilized by way of a processing unit or units and system memory such as those indicated, respectively, at 16' and 28' in FIG. 5, whether on a server computer, a client computer, a node computer in a distributed network, or any combination thereof.

Broadly contemplated herein, in accordance with at least one embodiment of the invention, are methods and arrangements which provide a method of computing geomagnetically-induced quasi-DC current flows in neutral, reactive power consumption and operating saturation conditions of a transformer, using even-order higher frequency components of current from a synchrophasor measurement unit. Further, there is broadly contemplated herein a system which uses the above-noted method to monitor and control the transformer during geomagnetic activity in the nearer term and proactively, thereby helping a system operator take corrective action before the occurrence of large geomagnetic disturbances.

The features discussed above, and others, relating to at least one embodiment of the invention, will be better appreciated from the discussion which follows.

In accordance with a general background relative to at least one embodiment of the invention, the monitoring of geomagnetically-induced currents is normally based on dedicated infrastructure (e.g., involving sensors) or on estimates from the measured reactive power absorbed in a transformer (e.g., using a SCADA [Supervisory Control and Data Acquisition] system). In such settings, if induced geomagnetic current exceeds a pre-defined threshold, then corrective action may be taken, yet no action is typically taken proactively, before the threshold is breached.

More particularly, in accordance with a general background relative to at least one embodiment of the invention, conventional monitoring systems are complex and often expensive yet perform no actual real-time monitoring. On the other hand, since corrective actions are reactive and not proactive, a large reactive power deficit can be incurred. Other drawbacks in such a scenario may include hotspot heating, voltage collapse and even blackouts during larger disturbances.

In accordance with at least one embodiment of the invention, it is recognized that with the advancement of synchrophasor technology, sampling higher-frequency components of current has become more manageable, and these components are now available at a faster rate (e.g., about 60 samples per second sec). By utilizing such higher-frequency components of current from phasor measurement units (PMUs), in conjunction with a derived model of the transformer, it is possible to compute the geomagnetically-induced current flows in the neutral, reactive power consumption and also a trace of the saturation condition of the transformer. More particularly, using forecasted geomagnetic data, predicted and near-time higher-frequency components of current as well as a derived model of the transformer, it is possible to proactively monitor the potential or actual impact of geomagnetic disturbances on a power system, and thereby mitigate or reduce such impact.

In accordance with at least one embodiment of the invention, effective monitoring, measurement and predicting in a manner as just described can be assisted via knowledge of the two-slope magnetizing characteristics of the transformer and even-order higher frequency components of current to model parameters including: saturation angle of the transformer, which then provides the trace of flux in the B-H curve; reactive power consumption; and geomagnetically-induced current flows in the transformer.

As schematically illustrated in FIG. 1, in accordance with at least one embodiment of the invention, a general system architecture may include, as main components, a prediction engine 101, a transformer analytics module 103 and a controls module 105. In a manner that can be better appreciated herebelow, transformer analytics module 103 can be fed by three main inputs (107, 109, 111), from the prediction engine 101 and two other sources, as shown. For its part, prediction engine 101 can provide (or obtain) a forecast of geomagnetic activity (113), which itself feeds into a predictor (115) of even-order high frequency components of a corresponding geomagnetically-influenced transformer current. These predicted components (111) are then fed to transformer analytics module 103. As mentioned above, a two-slope model of the transformer (107) is also fed as input to the analytics module 103. Further, the signal waveform of the actual transformer current (117) is fed to an FFT analyzer and phasor measurement unit 119, which then provides even-order higher frequency components of the actual transformer current (109) as input to analytics module 103.

In accordance with at least one embodiment of the invention, analytics module 103 includes three models: a saturation angle model 121, a reactive power model 123 and a neutral current model 125. Each of these models will be discussed in greater detail herebelow. Finally, controls module 105 includes a provision (e.g., sub-module) for proactive control (131) and for near-time monitor and control (133). Each of these functions are fed into by inputs 127 and 129, respectively, themselves deriving from output of the analytics module 103; input 127 represents predicted reactive power and neutral current, while input 129 represents present or ongoing parameters including estimated operating conditions, reactive power and neutral current.

Figure 2:
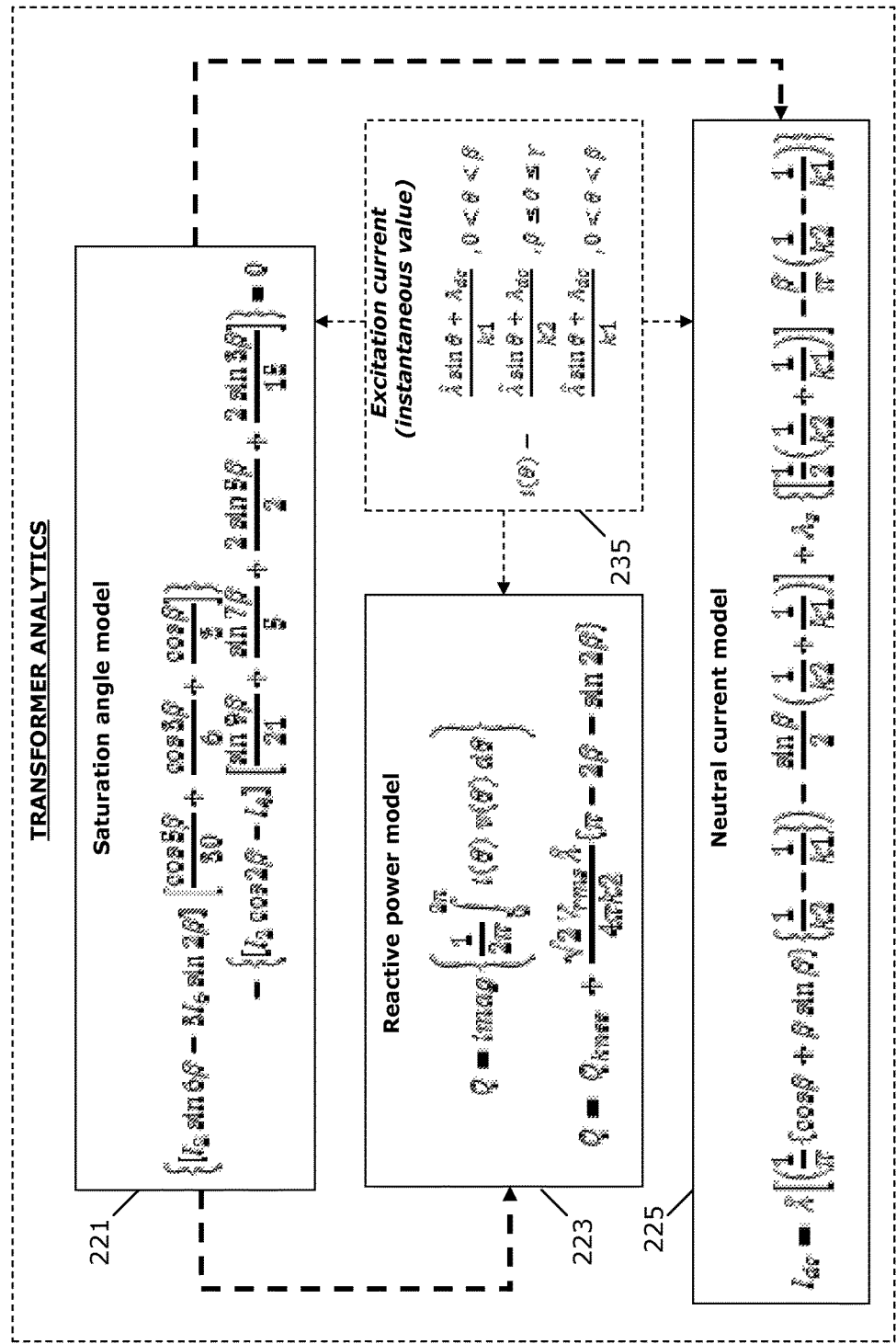
FIG. 2 sets forth some details relating to a transformer analytics module.
Figure 3:
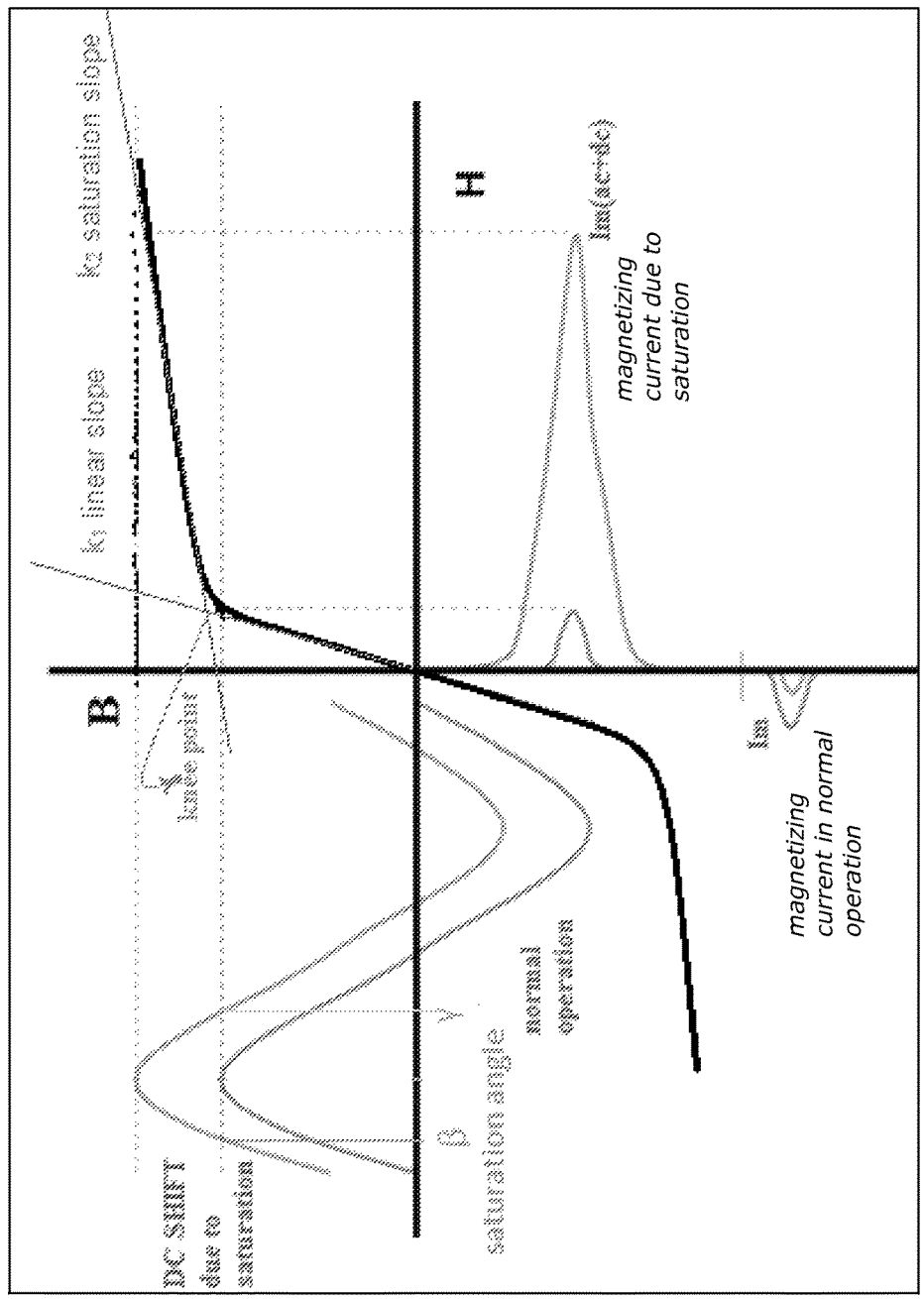
FIG. 3 provides a graph illustrating several components and parameters of transformer operation.

In accordance with at least one embodiment of the invention, FIG. 2 shows some details of a transformer analytics module 203, including equations associated with a saturation angle model (221), reactive power model (223) and neutral current model (225). (While reference numerals have been advanced here by 100 with respect to similar components in FIG. 1, continued reference may still be made to FIG. 1.) Additionally, to assist in the ensuing discussion, FIG. 3 provides a graph-based illustration of several components and parameters of transformer operation, including excitation current, magnetizing current and saturation.

In accordance with at least one embodiment of the invention, generally, all models 221/223/225 incorporate as input the instantaneous value of excitation current (235), i(θ), which can be derived as shown. To that end, θ refers to phase angle in radians, β represents saturation angle, γ represents the quantity (π−β), k1 is the linear slope of the magnetizing curve, k2 is the saturation slope and $\lambda_{dc}$ is the DC flux linkage offset. Thus, $i(\theta)$ is the instantaneous value of excitation current at any phase angle $\theta$.

In accordance with at least one embodiment of the invention, it can first be assumed that geomagnetically-induced current flow in the transformer is equal to the DC component of the resulting magnetizing current. Starting with saturation angle model 221, the saturation angle $\beta$ is a function of three even-order harmonics of the transformer magnetizing current (117 in FIG. 1) and of the slope of the magnetizing curve. Thus, $\beta=f(I_2, I_4, I_6,$ slope of magnetizing curve), and can be determined via solving equation 221 iteratively. Here, the saturation angle can be used as an indicator which defines operating condition of the transformer. It will now be appreciated that the saturation angle $\beta$ can be fed into each of the other models (223, 225).

In accordance with at least one embodiment of the invention, the reactive power consumption model (223) serves to derive the relationship between reactive power consumed during a geomagnetically-induced current and the saturation angle of the transformer; the upper equation in 223 can be solved first, followed by the lower equation. For the reactive power consumption model, Q represents total reactive power consumption; "imag" refers to the imaginary part of apparent or complex power (which itself includes a real part, active power, and an imaginary part, reactive power). $Q_{knee}$ represents reactive power at the knee point of the magnetizing curve, $i(\theta)$ is the instantaneous value of excitation current at any phase angle $\theta$, $V_{rms}$ is root-mean-square voltage, and $\lambda$ is the peak flux linkage.

In accordance with at least one embodiment of the invention, the neutral current model (225) serves to derive the relationship between the saturation angle and the geomagnetically-induced quasi-DC current flows in the transformer. Particularly, there is derived here the DC component of magnetizing current, $I_{dc}$. Generally, Fourier analysis is performed on the excitation current to evaluate the DC component and even-order harmonics. Here, $\lambda_s$ is the flux linkage knee point. It can be appreciated here that $\lambda_s$ and $\lambda$ are formulated in terms of even order harmonics ($I_2, I_4, I_6$).

Referring now back to FIG. 1, once predicted reactive power and neutral current are determined (127), proactive control 131 serves to install or integrate a reactive power source, reduce the loading condition on the transformer and/or reconfigure the network. On the other hand, once a determination is made of estimated operating conditions, reactive power and neutral current (129), near-time monitor and control 133 attends to saturation of the transformer, heating of the transformer, and reactive power demand.

More particularly, in accordance with at least one embodiment of the invention, proactive control 131 may function as follows. With the assistance of the transformer analytics module (103), even-order high frequency components of currents (109) and the two-slope characteristic model of the transformer (107), the system operator can monitor and visualize the quasi-DC current flows in the neutral, the reactive power consumption and the operating condition (flux) of the transformer in the control room. Also, aspects of the health of the transformer can be monitored, e.g., heating, saturation conditions, near-time reactive power demand, etc. Further, it then becomes possible to assume control of impact on the system, particularly on the transformer, by reducing the loading condition or bypassing the transformer, or by supplying the reactive power demand.

In accordance with at least one embodiment of the invention, near-time monitor and control 133 may function as follows. Using the predicted even-order high frequency components of currents from the forecasted geomagnetic data and the derived model of the transformer, the significant parameters such as quasi-DC current flow in the neutral, reactive power consumption and operating conditions can be estimated in advance. With help of estimated parameters of the transformer, a control room operator can act proactively to reduce the impact of geomagnetic disturbances on the power system by undertaking any or all actions such as reducing the loading conditions, reconfiguring the network, installing the reactive power reserve, adjusting the relay settings, etc.

It should be understood and appreciated, in accordance with at least one embodiment of the invention, that while the discussion herein has focused at least to some extent on induced geomagnetic currents (or geomagnetically-induced currents), embodiments may be configured in a manner so as to readily attend to virtually any analogous manner of major electromagnetic disturbances In brief recapitulation, it can be appreciated from the foregoing that predicted and near-time even higher-order frequency components, from synchrophasor measurement units, can be used to monitor and estimate operating conditions, geomagnetically induced currents and reactive power consumption in a transformer. This can be performed in real time and in advance, alike, thus permitting corrective action to be taken proactively by way of reducing potential or actual impact of geomagnetic disturbances.

It can be appreciated from the foregoing that, in accordance with at least one embodiment of invention, a technical improvement is represented at least via a method of computing geomagnetically-induced quasi-DC current flows in neutral, reactive power consumption and operating saturation conditions of a transformer, using even-order higher frequency components of current from a synchrophasor measurement unit.

In accordance with at least one embodiment of the invention, very generally, quantitative values as determined herein, or other data or information as used or created herein, can be stored in memory or displayed to a user on a screen, as might fit the needs of one or more users.

Figure 4:
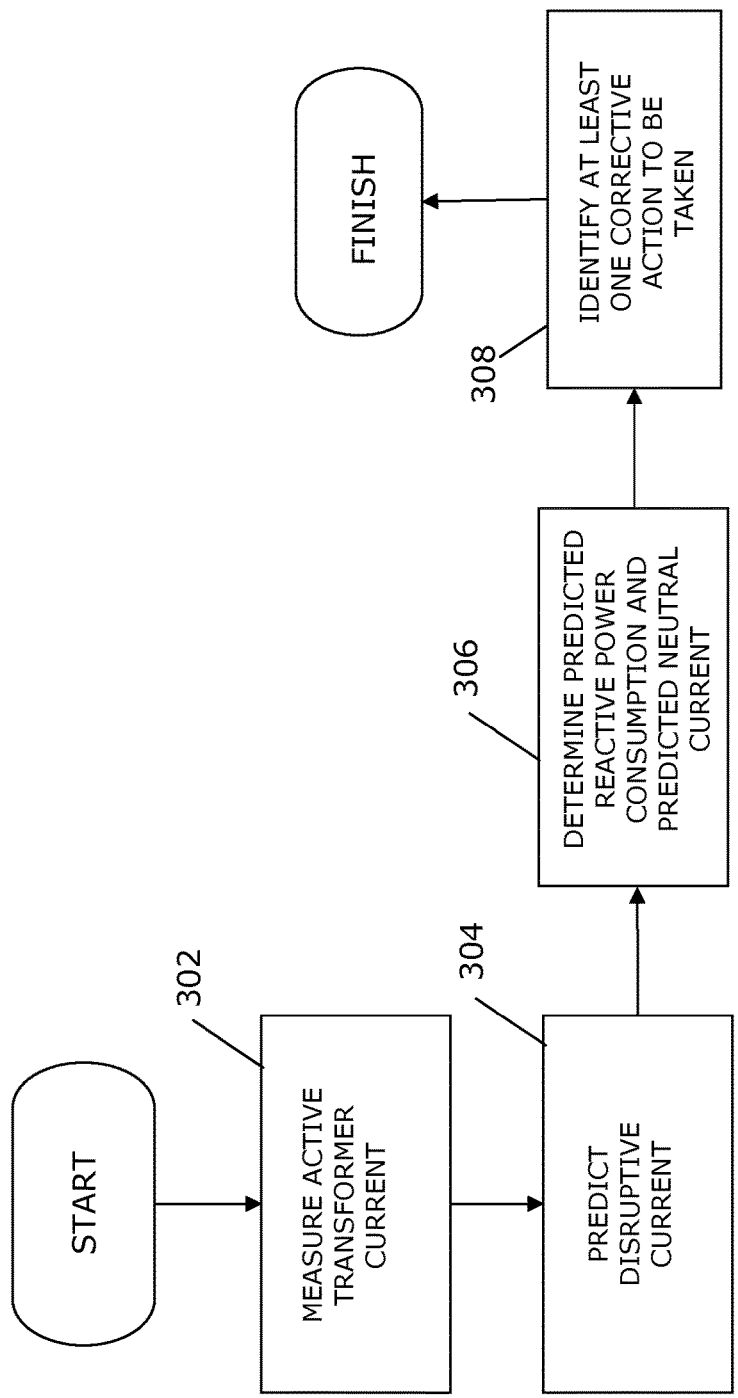
FIG. 4 sets forth a process more generally for computing disruptive current in a transformer.

FIG. 4 sets forth a process more generally for computing disruptive current in a transformer, in accordance with at least one embodiment of the invention. It should be appreciated that a process such as that broadly illustrated in FIG. 4 can be carried out on essentially any suitable computer system or set of computer systems, which may, by way of an illustrative and non-restrictive example, include a system such as that indicated at 12' in FIG. 5. In accordance with an example embodiment, most if not all of the process steps discussed with respect to FIG. 4 can be performed by way of a processing unit or units and system memory such as those indicated, respectively, at 16' and 28' in FIG. 5.

As shown in FIG. 4, in accordance with at least one embodiment of the invention, active current is measured in the transformer (302), and disruptive current in the transformer is predicted (304). Based on the active current and predicted disruptive current, a predicted reactive power consumption of the transformer and predicted neutral current of the transformer are determined (306). At least one corrective action, to be taken with respect to the transformer, is thereupon identified (308).

Figure 5:
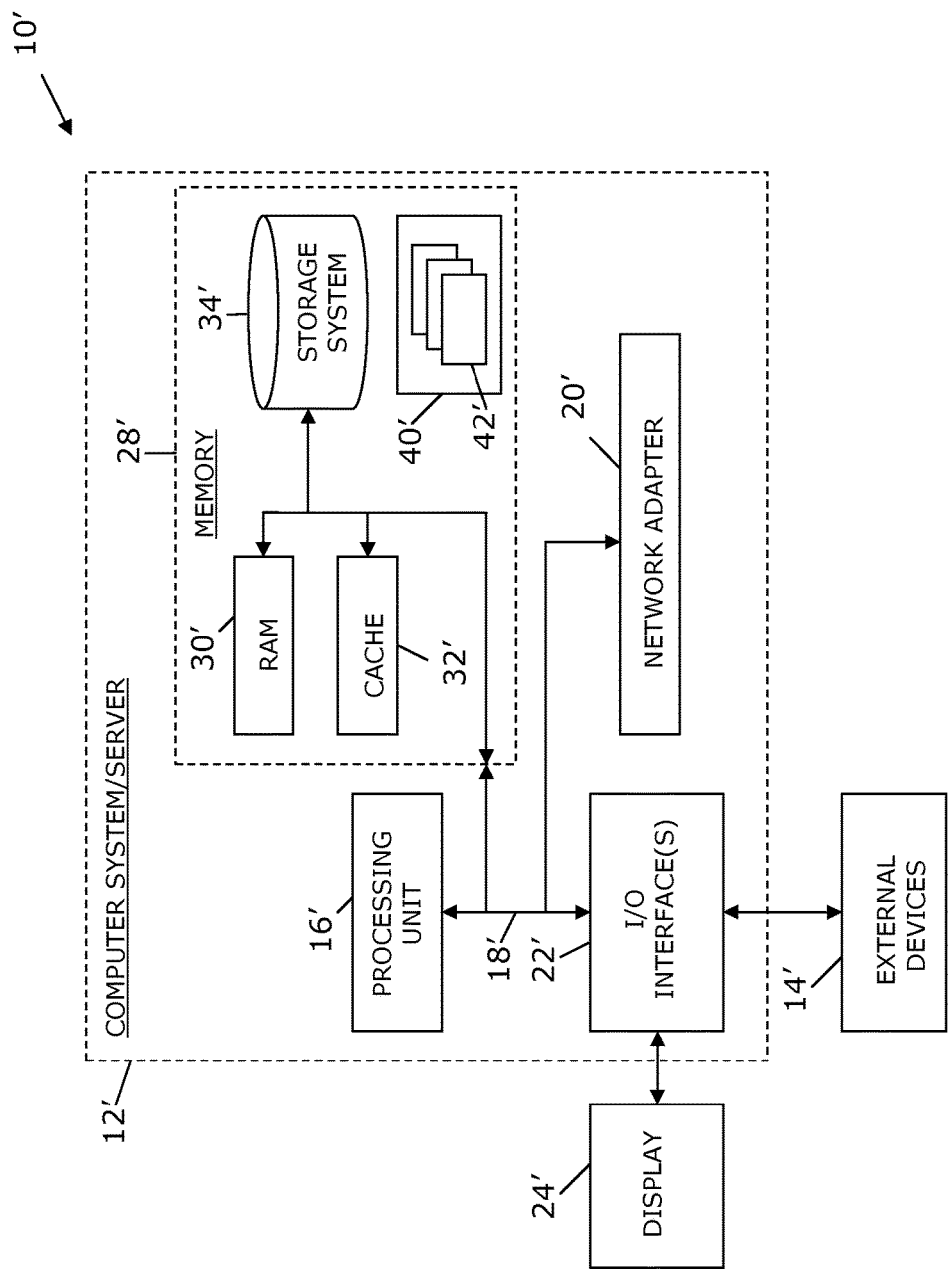
FIG. 5 illustrates a computer system.

Referring now to FIG. 5, a schematic of an example of a computing node is shown. Computing node 10' is only one example of a suitable computing node and is not intended to suggest any limitation as to the scope of use or functionality of embodiments of the invention described herein. Regardless, computing node 10' is capable of being implemented and/or performing any of the functionality set forth hereinabove. In accordance with embodiments of the invention, computing node 10' may be part of a cloud network or could be part of another type of distributed or other network (e.g., it could represent an enterprise server), or could represent a stand-alone node.

In computing node 10' there is a computer system/server 12', which is operational with numerous other general purpose or special purpose computing system environments or configurations. Examples of well-known computing systems, environments, and/or configurations that may be suitable for use with computer system/server 12' include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12' may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12' may be practiced in distributed cloud computing environments where tasks are performed by remote processing devices that are linked through a communications network. In a distributed cloud computing environment, program modules may be located in both local and remote computer system storage media including memory storage devices.

As shown in FIG. 5, computer system/server 12' in computing node 10' is shown in the form of a general-purpose computing device. The components of computer system/server 12' may include, but are not limited to, at least one processor or processing unit 16', a system memory 28', and a bus 18' that couples various system components including system memory 28' to processor 16'. Bus 18' represents at least one of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12' typically includes a variety of computer system readable media. Such media may be any available media that are accessible by computer system/server 12', and include both volatile and non-volatile media, removable and non-removable media.

System memory 28' can include computer system readable media in the form of volatile memory, such as random access memory (RAM) 30' and/or cache memory 32'. Computer system/server 12' may further include other removable/non-removable, volatile/non-volatile computer system storage media. By way of example only, storage system 34' can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18' by at least one data media interface. As will be further depicted and described below, memory 28' may include at least one program product having a set (e.g., at least one) of program modules that are configured to carry out the functions of embodiments of the invention.

Program/utility 40', having a set (at least one) of program modules 42', may be stored in memory 28' (by way of example, and not limitation), as well as an operating system, at least one application program, other program modules, and program data. Each of the operating systems, at least one application program, other program modules, and program data or some combination thereof, may include an implementation of a networking environment. Program modules 42' generally carry out the functions and/or methodologies of embodiments of the invention as described herein.

Computer system/server 12' may also communicate with at least one external device 14' such as a keyboard, a pointing device, a display 24', etc.; at least one device that enables a user to interact with computer system/server 12; and/or any devices (e.g., network card, modem, etc.) that enable computer system/server 12' to communicate with at least one other computing device. Such communication can occur via I/O interfaces 22'. Still yet, computer system/server 12' can communicate with at least one network such as a local area network (LAN), a general wide area network (WAN), and/or a public network (e.g., the Internet) via network adapter 20'. As depicted, network adapter 20' communicates with the other components of computer system/server 12' via bus 18'. It should be understood that although not shown, other hardware and/or software components could be used in conjunction with computer system/server 12'. Examples include, but are not limited to: microcode, device drivers, redundant processing units, external disk drive arrays, RAID systems, tape drives, and data archival storage systems, etc.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure.

Although illustrative embodiments of the invention have been described herein with reference to the accompanying drawings, it is to be understood that the embodiments of the invention are not limited to those precise embodiments, and that various other changes and modifications may be affected therein by one skilled in the art without departing from the scope or spirit of the disclosure.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of managing disruptive current to be caused by geomagnetic activity of a transformer in a power system, the method comprising:
 measuring, by at least one processor, present active current of the transformer;
 predicting, by at least one processor, a transformer current of the transformer based on a forecast of geomagnetic activity;
 extracting a first even-order higher frequency component of the measured present active current using a fast Fourier transform analyzer and using a phasor measurement unit;
 predicting, by the at least one processor, a second even-order higher frequency component of the predicted transformer current attributable to a potential disruptive current to be caused by the transformer;
 determining, by the at least one processor, based on the first even-order frequency component of the present active current and the second even-order frequency component of the predicted transformer current attributable to the predicted potential disruptive current, a predicted reactive power consumption of the transformer during the geomagnetic activity and a predicted neutral current of the transformer during the geomagnetic activity;

identifying, by the at least one processor, at least one corrective action to be proactively taken with respect to the transformer to address the geomagnetic activity, based on the predicted reactive power consumption and the predicted neutral current, the at least one corrective action including reducing load conditions of the power system; and causing, by the at least one processor, to reduce load conditions of the power system, thereby mitigating or reducing the impact of the geomagnetic activities on the power system.

2. The method according to claim 1, wherein the determining comprises determining, by the at least one processor, based on the first even-order frequency component of the present active current and the second even-order frequency component of the predicted transformer current attributable to the predicted potential disruptive current, estimated active parameters of the transformer.

3. The method according to claim 2, wherein the estimated active parameters include operating conditions, the predicted reactive power consumption and the predicted neutral current.

4. The method according to claim 3, wherein the operating conditions include transformer flux.

5. The method according to claim 1, wherein the disruptive current comprises a current induced by an electromagnetic disturbance.

6. The method according to claim 1, wherein the disruptive current comprises a geomagnetically-induced current.

7. The method according to claim 1, wherein the determining comprises modeling a saturation angle of the transformer.

8. The method according to claim 7, wherein:
the determining of the predicted neutral current comprises modeling neutral current of the transformer; and
the modeling of neutral current comprises incorporating the modeled saturation angle.

9. The method according to claim 8, wherein the modeling of neutral current comprises deriving a relationship between current flows induced in the transformer by the disruptive current and the modeled saturation angle.

10. The method according to claim 7, wherein:
the determining of the predicted reactive power consumption comprises modeling reactive power consumption of the transformer; and
the modeling of reactive power consumption comprises incorporating the modeled saturation angle.

11. The method according to claim 10, wherein the modeling of reactive power consumption comprises deriving a relationship between reactive power consumed during a disruptive current and the modeled saturation angle.

12. An apparatus for managing disruptive current to be caused by geomagnetic activity of a transformer in a power system, the apparatus comprising:
at least one processor; and
a non-transitory computer readable storage medium to store computer readable program code that when executed by the at least one processor causes the apparatus to perform a method, the method comprising:
measuring, by the at least one processor, present active current of the transformer;
predicting, by the at least one processor, transformer current of the transformer based on a forecast of geomagnetic activity;
extracting a first even-order higher frequency component of the measured present active current using a fast Fourier transform analyzer and using a phasor measurement unit;
predicting, by the at least one processor, a second even-order higher frequency components of predicted transformer current attributable to potential disruptive current to be caused by the transformer;
determining, by the at least one processor, based on the first even-order frequency component of the present active current and the second even-order frequency component of the predicted transformer current attributable to the potential disruptive current, a predicted reactive power consumption of the transformer during the geomagnetic activity and a predicted neutral current of the transformer during the geomagnetic activity;
identifying, by the at least one processor, at least one corrective action to be proactively taken with respect to the transformer to address the geomagnetic activity, based on the predicted reactive power consumption and the predicted neutral current, the at least one corrective action including reducing loading conditions of the power system; and
causing, by the at least one processor, to reduce load conditions of the power system, thereby mitigating or reducing the impact of geomagnetic activities on the power system.

13. A non-transitory computer program product for managing disruptive current to be caused by geomagnetic activity of a transformer in a power system, the non-transitory computer program product comprising:
at least one processor; and
a non-transitory computer readable storage medium to store computer readable program code that, when executed by the at least one processor causes the at least one processor to perform a method, the method comprising:
measuring, by the at least one processor, present active current of the transformer;
predicting, by the at least one processor, transformer current of the transformer based on a forecast of geomagnetic activity;
extracting, a first even-order higher frequency component of the measured present active current using a fast Fourier transform analyzer and using a phasor measurement unit;
predicting, by the at least one processor, a second even-order higher frequency component of the predicted transformer current attributable to potential disruptive current to be caused by the transformer;
determining, by the at least one processor, based on the first even-order frequency component of the present active current and the second even-order frequency component of the predicted transformer current attributable to the predicted potential disruptive current, a predicted reactive power consumption of the transformer during the geomagnetic activity and a predicted neutral current of the transformer during the geomagnetic activity;
identifying, by the at least one processor, at least one corrective action to be proactively taken with respect to the transformer to address the geomagnetic activity, based on the predicted reactive power consumption and the predicted neutral current; and
causing, by the at least one processor, the identified at least one corrective action to be proactively taken with respect to the transformer to address the geomagnetic activity, thereby mitigating or reducing the impact of the geomagnetic activities on a power system.

14. The non-transitory computer program product according to claim 13, comprising the non-transitory computer readable storage medium to store computer readable program code that, when executed by the at least one processor causes the at least one processor to perform a method, the method further comprising: determining, by the at least one processor, estimated active parameters of the transformer based on the active transformer current and predicted disruptive current.

15. The non-transitory computer program product according to claim 13, wherein the disruptive current comprises a current induced by an electromagnetic disturbance.

16. The non-transitory computer program product according to claim 13, wherein the determining comprises modeling a saturation angle of the transformer.

17. A method comprising:
  causing, by at least one processor, present active current in a transformer of a power system to be measured, the measuring comprising determining a first set of even-order higher frequency components of the present active current of the transformer;
  predicting, by the at least one processor, potential disruptive current to be caused by the transformer, the predicting comprising predicting a second set of even-order higher frequency components of the predicted transformer current attributable to the predicted potential disruptive current to be caused based on a forecast of geomagnetic activity, wherein the potential disruptive current comprises a geomagnetically-induced current;
  determining, by the at least one processor, based on the first set of even-order frequency components of the present active current and the second set of even-order frequency components of the predicted transformer current attributable to the predicted potential disruptive current, estimated active parameters of the transformer, which includes operating conditions, a predicted reactive power consumption of the transformer during the geomagnetic activity, and a predicted neutral current of the transformer during the geomagnetic activity;
  identifying, by the at least one processor, at least one corrective action to be proactively taken with respect to the transformer to address the geomagnetic activity, at least based on the predicted reactive power consumption and the predicted neutral current, the at least one corrective action including reducing load conditions of the power system; and
  causing, by the at least one processor, to reduce load conditions of the power system, thereby mitigating or reducing the impact of the geomagnetic activities on the power system.

* * * * *